Oct. 20, 1964 R. B. BARNES 3,153,343

MULTIPLE ELEMENT THERMAL DETECTOR

Filed Oct. 16, 1962

INVENTOR.
ROBERT BOWLING BARNES
BY Robert Ames Norton
ATTORNEY

United States Patent Office 3,153,343
Patented Oct. 20, 1964

3,153,343
MULTIPLE ELEMENT THERMAL DETECTOR
Robert Bowling Barnes, Stamford, Conn., assignor to Barnes Engineering Company, Stamford, Conn., a corporation of Delaware
Filed Oct. 16, 1962, Ser. No. 230,910
12 Claims. (Cl. 73—355)

This invention relates to improved heat sink backed multiple thermal detectors.

Multiple thermal detectors mounted on a heat sink have achieved extremely wide use particularly in instruments operating in the infrared where the thermal detectors respond even to very long wave infrared radiation. Because of the simpler and more effective electronic processing circuits operating on A.C. signals it is customary in a great many instruments to interrupt the radiation periodically by suitable choppers or other mechanisms such as scanning reticles. It is very common to mount the thermal detectors in pairs in series in a bridge circuit. This is particularly used with thermistors where one thermistor flake is exposed to radiation and the other is shielded from radition to eliminate the effects of ambient temperature. It is also common to use pluralities of thermal detectors of the tremocouple or thermopile type.

When a thermal detector is exposed to interrupted radiation it must be able to heat up and cool down sufficiently rapidly so as to possess a satisfactorily short time constant and a sufficiently rapid response. This has necessitated a heat sink to which the thermal detector conducts its heat during the period when it is not irradiated. Various types of heat sinks have been used, for example dielectric heat sinks such as fused alumina, commonly referred to as sapphire, beryllium oxide and the like. Metal heat sinks such as copper and aluminum are also in common use. When the heat sink is a dielectric the thermal detectors may be mounted directly on it. In the case of conductive heat sinks such as metals it is, of course, necessary to interpose a thin insulating layer between the thermal detector and the conducting heat sink in order to prevent short circuiting of the signal. Even with insulating substrates a thin layer of material of low heat conductivity is often used in order to be able to determine precisely the time constant of the particular detector.

The requirements of a heat sink are simple and well known. The first requirement, of course, is adequate heat capacity but this is normally no problem as the heat sink is ordinarily enormous in comparison to the very small heat capacity of the active elements of the thermal detectors. The second extremely important characteristic of a good heat sink is that it shall conduct heat very rapidly so that the cooling off of the thermal detector elements during the time they are not irradiated is effected rapidly and reliably. This chacteristic of good heat conductivity is also of importance in thermal detectors of precisely determined time constants because it is, of course, necessary that the accurately dimensioned thin layer of material of low heat conductivity shall constitute practically the only thermal impedance. Unfortunately the characteristic of high heat conductivity, which is so essential to a good heat sink, is also a drawback because the heat is conducted sideways just as well as directly down to the heat sink and this sideways conduction can blur the response of multiple thermal detectors mounted close to each other producing effects which are analagous to crosstalk in electrical circuits. This problem is a serious one when it is desired to have a number of thermal detectors closely placed and has been one of the limiting factors to the useful field for multiple thermal detectors. It is with a solution of this problem or perhaps more correctly with its substantial elimination that the present invention deals.

Essentially the present invention utilizes as heat sinks materials which are elements or compounds of the third, fourth and fifth groups of the periodic system. They may include only elements of the fourth system or compounds of elements of the third and fifth series. In each case the average valence of the chemical elements is four and this term will be used throughout the specification and claims for simplicity and brevity. The materials are special anisotropic forms of the elements or compounds respectively. Typical materials are pyrolytic graphite, silicon of analogous crystal structure or compounds of elements of the third and fifth groups showing similar crystal properties such as the anisotropic form of boron nitride. A compound such as boron nitride has some advantages over the elements such as pyrolytic graphite and similar forms of silicon, in that it is an insulator and, therefore, the need for an insulation layer does not arise. Also as compared to pyrolytic graphite, the compounds show better mechanical charcteristics. Therefore, for many uses they are preferred.

When properly prepared the heat sinks of the present invention show a very great degree of thermal anisotropicity, ratios of 100 to 1 or more being obtainable with some of the best materials. In some cases some temperature ratios of 1000 have been noted. When used in the present invention, the anisotropic heat sink is arranged with its direction of high thermal conductivity normal to the surface on which the thermal detectors are mounted and with its direction of low thermal conductivity at right angles thereto. The present invention thereby produces a heat sink which has all of the desirable qualities of rapid conduction of heat from the thermal detectors and at the same time does not possess the drawback of rapid thermal conductivity sideways so that even when mounted very closely together mutiple thermal detectors do not interfere with each other. The present invention, therefore, represents on of those happy situations where a drawback is eliminated without compromising desirable characteristics.

The thermal aniso tropy of the heat sinks of the present invention behaves very much as do other anisotropies such as electrical and magnetic, that is to say it is not an "all or nothing" proposition. Materials can be prepared in which the anisotropy is at a maximum and it is also possible, and in many cases unavoidable, to produce materials which do not reach 100% of the theoretically possible anisotropy. This is true in the case of the heat sinks of the present invention. It is often not necessary that the material have the highest possible theoretical anisotropy so long as the anisotropy is very strong and sufficient to prevent significant sideways thermal conduction so that one thermal detector does not interfere with another. This possibility of using materials which are not theoretically perfect is a practical advantage as it permits using commercially available material which can sometimes be produced at a considerably lower cost. The present invention, therefore, includes materials which do not exhibit the ultimate, theoretically possible anisotropy and the expression "strongly thermally anisotropic" will be used to refer to materials in which the thermal conductivity in one direction is at least an order of magnitude less than in the preferred direction.

The thermal anisotropy of the materials used as heat sinks in the present invention is definitely tied up with crystal structure. While it is not desired to limit the present invention to any particular theory of operation especially at the subatomic level, a brief description of crystal structure will make the nature of the materials clear. The crystal structure has been worked out in greatest detail with pyrolytic graphite and, although for some purposes this is not the best material, it serves as an excellent material for descriptive purposes of the type of crystal structure involved. Carbon exists in two crystal structures, a cubic lattice which is associated with the very hard diamond and hexagonal layer crystals which are typical of graphite. When graphite is deposited pyrolytically a very accurate orientation of the hexagonal crystals becomes possible.

In the case of pyrolytic graphite the thermal conductivity is relatively high along the a-axis, that is to say crystallites having layer planes parallel to the deposition surface on which they are pyrolytically deposited. The conductivity is low at right angles that is to say along the c-axis. It should be noted that the graphite does not have to be a single crystal as polycrystalline materials in which the orientation is maintained with sufficient precision also exhibit useful degrees of anisotropicity.

Boron nitride which constitutes a preferred material has not been investigated in as great detail as pyrolytic graphite but the same correlation with crystal structure is observed. The very hard borazon form which has the cubic crystals of the diamond structure and resembles it in extreme hardness is not thermally anisotropic. The much softer material having hardnesses ranging from one to two has a crystal structure very similar to that of graphite and when this material is pyrolytically deposited at high temperatures the crystals can be oriented in the same way as pyrolytic graphite and a material of comparably high thermal anisotropy results.

At present the thermally anisotropic materials used in the present inventions are practically produced by pyrolytic processes. The invention, of course, is not concerned with the process by which the material is made and covers any materials having the anisotropic thermal properties regardless of how they may have been made.

The present invention is applicable to multiple detectors of all configurations. Thus, it may be used with unimmersed detectors in which the detecting elements are mounted on a heat sink, suitably oriented for thermal conductivity directions, or the detectors may be immersed, that is to say the heat sink constitutes a lens through which radiation passes before it strikes the sensitive elements themselves. In the case of unimmersed detectors the optical properties of the heat sink are, of course, immaterial. However, in the case of immersed detectors this is no longer true and here some of the materials used in the present invention present interesting characteristics. Pyrolytic graphite does not transmit in the visible but begins transmission in the infrared at about 2.5μ and extends to the long range infrared of 25 to 35μ and beyond. Anisotropic boron nitride has some transmission in the visible and in the near infrared falling off rather sharply at 3.5μ. It begins transmitting again at about 14μ and reaches good transmission which extends far on into the long range infrared. The transmission is never more than moderate but for instruments where this moderate transmission is adequate the material may be used as a lens. While ordinarily not particularly needed it is interesting to note that pyrolytic graphite is a good polarizer in the long wave infrared and where such properties are desirable this constitutes an additional advantage of the present invention. The polarizing characteristics of thermally anisotropic boron nitride have not been investigated to the same degree but it seems probable that this material will also exhibit polarizing properties in the infrared.

It is an advantage of the present invention that it is useful with practically any thermal detector, for example any thermistor material may be used such as the mixed oxide thermistors or the more recent very thin film semiconductor thermistors of germanium and silicon. Thermocouples of any design may be used but the present invention is particularly useful with the solid backed thermocouples and thermopiles which are described in the copending application of Hall and Astheimer, Serial No. 189,554 filed April 23, 1962.

The invention will be described in greater detail in conjunction with the drawings in which.

Figure 1:
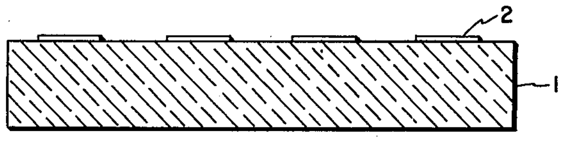
FIG. 1 is a cross section through a multiple thermal detector.
Figure 2:
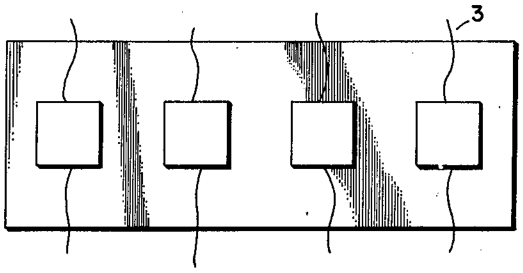
FIG. 2 is a plan view.

The multiple thermal detector shown on FIGS. 1 and 2 is one utilizing thermistors. The thermistors 2 are mounted side by side on a boron nitride substrate 1, the leads for bias voltage being shown at 3. As the present invention is not concerned with and does not change the electrical circuits they have not been shown. The heat sink 1 is strongly thermally anisotropic and is arranged with its direction of high thermal conductivity normal to the surface. Accordingly the thermistors cool off quickly during the intervals when they are not subjected to radiation but there is so low a thermal conductivity at right angles, that is to say along the heat sink from one thermistor to another, that there is no measurable interference of one thermistor flake with another.

In the drawings the thermistor flakes are shown separated by a considerable distance for clarity. In actual multiple detectors where the present invention is of particular importance the thermal detectors are much more closely spaced, for example they may be spaced in an array or mosaic and it is particularly in such closely spaced arrangements that the present invention effects the greatest improvement.

In the case of immersed detectors it is more common to have only two thermistor flakes but, of course, the advantages of the present invention are obtained to the same degree. Where its only moderate transmission is adequate boron nitride is a useful lens material though its refractive index is not as high as silicon or as germanium which is frequently used for immersion optics. When lenses of boron nitride are made the additional advantage is obtained that the lens is not a conductor of electricity and therefore insulation layers which somewhat degrade the perfection of immersion are not needed. This is an additional advantage of the present invention although, of course, much less important than the primary advantage of elimination of thermal conductivity from one detector to another.

I claim:

1. A multiple thermal detector comprising in combination, (a) a plurality of thermal detectors mounted on a single heat sink, (b) the heat sink being composed of strongly thermally anisotropic material formed of elements of the third, fourth and fifth groups of the periodic system, the material having an average valence of four and (c) the direction of maximum thermal conductivity being normal to the surface of the heat sink on which the thermal detectors are mounted.

2. A multiple thermal detector according to claim 1 in which the thermal detectors are thermistors.

3. A multiple thermal detector according to claim 1 in which the thermal detectors are thermocouples.

4. A multiple thermal detector according to claim 1 in which the heat sink is in the form of a lens and the thermal detectors are immersed thereon.

5. A multiple thermal detector according to claim 4 in which the detector elements are thermistors.

6. A multiple detector according to claim 4 in which the thermal detectors are thermocouples.

7. A multiple detector according to claim 1 in which the heat sink is composed of strongly thermally anisotropic boron nitride.

8. A multiple thermal detector according to claim 7 in which the thermal detectors are thermistors.

9. A multiple thermal detector according to claim 7 in which the thermal detectors are thermocouples.

10. A multiple thermal detector according to claim 7 in which the heat sink is in the form of a lens and the thermal detectors are immersed thereon.

11. A multiple thermal detector according to claim 10 in which the detector elements are thermistors.

12. A multiple detector according to claim 10 in which the thermal detectors are thermocouples.

No references cited.